US012781123B2

(12) United States Patent
Kim et al.

(10) Patent No.: US 12,781,123 B2
(45) Date of Patent: Nov. 3, 2026

(54) LIGHT-EMITTING LAYER INK COMPOSITION, AND ELECTROLUMINESCENT DEVICE USING SAME

(71) Applicant: Hansol Chemical Co., Ltd., Seoul (KR)

(72) Inventors: So Mang Kim, Jeonju (KR); Jae Hong Noh, Jeonju (KR); Do Hyeong Kim, Bongdong (KR); Kyung Nam Kim, Daejeon (KR); Sung Min Ha, Jeonju (KR); Chun Rae Nam, Jeonju (KR)

(73) Assignee: Hansol Chemical Co., Ltd., Seoul (KR)

( * ) Notice: Subject to any disclaimer, the term of this patent is extended or adjusted under 35 U.S.C. 154(b) by 343 days.

(21) Appl. No.: 18/692,590

(22) PCT Filed: Aug. 31, 2022

(86) PCT No.: PCT/KR2022/013056
§ 371 (c)(1),
(2) Date: Mar. 15, 2024

(87) PCT Pub. No.: WO2023/043096
PCT Pub. Date: Mar. 23, 2023

(65) Prior Publication Data

US 2024/0384165 A1 Nov. 21, 2024

(30) Foreign Application Priority Data

Sep. 17, 2021 (KR) ........................ 10-2021-0124890

(51) Int. Cl.
*C09K 11/70* (2006.01)
*C09D 11/322* (2014.01)
(Continued)

(52) U.S. Cl.
CPC ............ *C09K 11/70* (2013.01); *C09D 11/322* (2013.01); *C09D 11/38* (2013.01); *C09K 11/02* (2013.01);
(Continued)

(58) Field of Classification Search
None
See application file for complete search history.

(56) References Cited

U.S. PATENT DOCUMENTS

2012/0095110 A1 4/2012 Findlay et al.
2013/0189896 A1 7/2013 Nishizawa et al.
(Continued)

FOREIGN PATENT DOCUMENTS

JP 2021-128341 A 9/2021
KR 10-2012-0115220 A 10/2012
(Continued)

*Primary Examiner* — Sarah K Salerno
(74) *Attorney, Agent, or Firm* — Young Basile Hanlon & MacFarlane, P.C.

(57) ABSTRACT

An electron transport layer composition for inkjet printing is described. The composition includes metal oxide nanoparticles and at least three solvents being different in terms of at least one of viscosity, polarity, or vapor pressure. A method for preparing the composition and a light-emitting device having an electron transport layer formed from the composition are also described.

20 Claims, 10 Drawing Sheets

(51) Int. Cl.

| | |
|---|---|
| ***C09D 11/38*** | (2014.01) |
| ***C09K 11/02*** | (2006.01) |
| ***C09K 11/56*** | (2006.01) |
| ***C09K 11/88*** | (2006.01) |
| ***H10K 50/115*** | (2023.01) |
| ***H10K 71/13*** | (2023.01) |

(52) U.S. Cl.
CPC .......... *C09K 11/565* (2013.01); *C09K 11/883* (2013.01); *H10K 50/115* (2023.02); *H10K 71/135* (2023.02)

(56) References Cited

U.S. PATENT DOCUMENTS

| | | | | |
|---|---|---|---|---|
| 2020/0373508 | A1* | 11/2020 | Li .......................... | C09D 11/32 |
| 2021/0009826 | A1 | 1/2021 | Kizaki et al. | |
| 2021/0009893 | A1 | 1/2021 | Kim et al. | |

FOREIGN PATENT DOCUMENTS

| | | | |
|---|---|---|---|
| KR | 10-2013-0111547 | A | 10/2013 |
| KR | 10-2020-0084328 | A | 7/2020 |
| KR | 10-2021-0008304 | A | 1/2021 |
| WO | 2012/043151 | A1 | 4/2012 |
| WO | 2019/093140 | A1 | 5/2019 |

* cited by examiner

LIGHT-EMITTING LAYER INK COMPOSITION, AND ELECTROLUMINESCENT DEVICE USING SAME

CROSS-REFERENCE TO RELATED APPLICATION

This application claims priority under 35 U.S.C. § 119 to Korean Patent Application No. 10-2021-0124890, filed on Sep. 17, 2021, in the Korean Intellectual Property Office (KIPO), the disclosure of which is incorporated by reference herein in its entirety.

TECHNICAL FIELD

The present invention relates to a light-emitting layer ink composition for electroluminescence applicable to inkjet printing and a light-emitting device including an light-emitting layer formed of the composition.

BACKGROUND

Techniques for forming quantum dot patterns inside electronic devices are required to utilize quantum dot materials in the electronic devices. One of the most general methods to form quantum dot patterns is patterning quantum dots directly on substrates by vacuum deposition. However, unlike light-emitting organic molecules, quantum dot materials do not facilitate vacuum deposition due to their heavy mass and cannot be deposited as in self-luminous organic light emitting diodes (OLEDs) due to their vulnerability to heat and moisture.

To solve the above problems, proposed methods involve transferring a quantum dot material onto a substrate, similar to stamping, performing printing using the same principles as in an inkjet printer, and the like. The transferring method is difficult to apply to large-area substrates because there is a limit to increasing the size of stamps. Therefore, inkjet printing type quantum dot light-emitting devices (QLEDs) through making quantum dot materials into inks are being mainly studied.

Although numerous studies have recently focused on inkjet printing type quantum dot solutions, light-emitting layers (emission layer, EMLs) for inkjets are relatively scarcely studied. In particular, studies on the composition of light-emitting layers (EMLs) capable of inkjet printing are essentially required to form uniform light-emitting layers.

SUMMARY

The present invention has been made to solve the above-mentioned problems, and an aspect of the present invention is to provide a light-emitting layer ink composition, wherein a quantum dot solution containing a quantum dot and a solvent is made into an ink by addition of a small amount of a dispersant, so that a light-emitting layer can be formed by inkjet printing and a uniform film can be formed through an alleviation in the coffee ring effect resulting from the addition of the dispersant.

Another aspect of the present invention is to provide a light-emitting device including a light-emitting layer formed by inkjet printing using the above-described ink composition.

Other aspects and advantages of the present disclosure will be clarified by the following detailed description and claims.

In accordance with an aspect of the present invention, there is provided a light-emitting layer ink composition, including: quantum dots; a (meth)acrylic based dispersant; and a solvent, wherein the (meth)acrylic based dispersant is contained in a content of 30 vol % or less relative to 100 vol % of the solvent.

In an embodiment according to the present invention, the solvent may have a vapor pressure of 0.001 mmHg or higher.

In an embodiment according to the present invention, the solvent may include at least two solvents with different vapor pressures.

In an embodiment according to the present invention, the (meth)acrylic based dispersant may be a di(meth)acrylic compound.

In an embodiment according to the present invention, the quantum dots may be contained in a content of 1 to 30 wt % relative to the total weight of the composition.

In an embodiment according to the present invention, the quantum dots may include at least one type of red light-emitting quantum dots, green light-emitting quantum dots, and/or blue light-emitting quantum dots.

In an embodiment according to the present invention, the composition may have a viscosity of 1.0 to 5.0 cps at 20° C., a vapor pressure of 0.1 to 10 mmHg at 20° C., a contact angle of 10 to 30°, and a solid content of 30 wt % or less.

In an embodiment according to the present invention, through the removal of volatile components, the solvent and the dispersant may be contained in a content of 10 vol % or less in a print pattern formed after jetting.

In an embodiment according to the present invention, the height (HI) of a print pattern after jetting may be 500 to 2,000 μm, and the height (HF) of a print pattern after drying may be 5 to 60 nm.

In accordance with another aspect of the present invention, there is provided a light-emitting device, including: a first electrode; a second electrode disposed to face the first electrode; an light-emitting layer disposed between the first electrode and the second electrode and formed of any above-described light-emitting layer ink composition; a hole transport layer disposed between the first electrode and the light-emitting layer; and an electron transport layer disposed between the light-emitting layer and the second electrode.

In an embodiment according to the present invention, the light-emitting layer may be formed by inkjet printing.

In an embodiment according to the present invention, the light-emitting device may further include at least one of a hole injection layer or an electron injection layer.

According to an embodiment of the present invention, a light-emitting layer ink composition for an electroluminescent device can be provided that facilitates uniform ejection by an inkjet method and enables the formation of a uniform film for an light-emitting layer through the ejected ink, by mixing a small amount of a dispersant with a quantum dot solution containing quantum dots and a solvent to make an ink.

Therefore, the light-emitting layer ink composition according to embodiments of the present invention can not only be advantageously applied to the fabrication of light-emitting devices, specifically, self-luminous displays, through inkjet printing, but also offer more advantageous effects for commercialization and scaling up by applying a simple and inexpensive inkjet process.

The advantageous effects according to the present disclosure are not limited by the contents exemplified above, and more various advantageous effects are included herein.

DETAILED DESCRIPTION

Figure 1:
FIG. 1 shows an image depicting light-emitting layer ink compositions prepared in Example 1.

Hereinafter, the present disclosure will be described in detail.

All terms (including technical and scientific terms) used in this specification, unless otherwise defined, may be used in the meaning commonly understood by those of ordinary skill in the art to which the present invention pertains. In addition, terms defined in a commonly used dictionary are not to be interpreted ideally or excessively unless clearly defined in particular.

Throughout the specification, when a certain part "includes", "contains", or "comprises" a certain element, such an expression is to be understood as open-ended terms having the possibility of further including another element but not excluding another element, unless otherwise stated. Throughout the specification, "above" or "on" means not only when it is located above or under the target part, but also includes the case where there is another part in the middle, and it does not mean that it is positioned above with respect to the direction of gravity.

Herein, "(meth)acrylate" indicates acrylate and methacrylate, "(meth)acryl" indicates acryl and methacryl, and "(meth)acryloyl" indicates acryloyl and methacryloyl.

Herein, "monomeric substance" has the same meaning as "monomer". The monomer as used in the present invention is differentiated from an oligomer and a polymer and refers to a compound having a weight average molecular weight of 1,000 or less.

An aspect of the present invention is to provide an ink composition for forming a light-emitting layer of an electroluminescent device, which enables the ejection of ink and the formation of a uniform film formation by inkjet printing and can implement device characteristics.

In the present invention, a small amount of a dispersant is added and mixed with solvents in which red, green, and/or blue quantum dots are dissolved, thereby significantly alleviating the coffee ring effect (CRF) upon inkjet ejection, thus ensuring the uniformity of a film. That is, in the conventional ink compositions, the outline of a droplet was not moved upon the evaporation of a solvent, which is a cause of the coffee ring effect. In contrast, in the ink composition of the present invention with a predetermined dispersant, the outline of a droplet gradually and regularly contracts towards the center as evaporation progresses, thereby alleviating the coffee ring effect.

Furthermore, in the present invention, a light-emitting layer can be formed through inkjet printing by selecting an ejectable solvent considering appropriate viscosity and vapor pressure of inkjet equipment and using the solvent as a solvent for an ink composition. Additionally, the solvent is easily volatilized and removed under general device fabrication conditions, thereby ensuring a high-quality light-emitting layer composed of quantum dots.

Accordingly, the present invention can provide a light-emitting layer through inkjet printing and a self-luminous display including the same, specifically, a quantum dot QLED.

Light-Emitting Layer Ink Compositions

A light-emitting layer ink composition according to an embodiment of the present invention is a quantum dot ink composition, which can be ejected by general inkjet printing to form a uniform film type light-emitting layer (EML) for an electroluminescent device. Such an ink composition is distinguished from conventional ink compositions in that the ink compositions do not contain a resin, inorganic particles, a scattering agent and/or an additional dispersant. Thus, a final light-emitting layer is composed of a quantum dot.

In an embodiment, the composition contains a quantum dot, an acrylic dispersant, and a solvent, wherein the dispersant is contained in a predetermined content. The composition may further contain, if necessary, at least one additive that is common in the art.

Hereinafter, the composition of the light-emitting layer composition will be described in detail.

Quantum Dots

The light-emitting layer ink composition according to the present invention may use typical quantum dots known in the art, without limitation.

The quantum dot (QD) may be called a nano-sized semiconductor material. Atoms constitute a molecule, and molecules constitute a set of small molecules called a cluster to form a nano-particle. When a nano-particle has semiconductor characteristics, it may be referred to as a quantum dot. When the quantum dot reaches an excited state by receiving the energy from the outside, the quantum dot autonomously emits energy based on a corresponding energy band gap.

Such a quantum dot may have a homogeneous single-layer structure; a multi-layer structure, such as a core-shell type or a gradient structure; or a mixed structure thereof. In a case where the shell has a plurality of layers, the respective layers may contain different components, for example, (semi)metal oxides.

The quantum dot (QD) may be freely selected from a group II-VI compound, a group III-V compound, a group IV-VI compound, a group IV element, a group IV compound, and a combination thereof. In a case where the quantum dot has a core-shell form, a component of each of the core and at least one layer of the shell may be selected from a group II-VI compound, a group III-V compound, a group IV-VI compound, a group IV element, a group IV compound, and a combination thereof, which are to be described later, and more specifically, may be freely configured from the components illustrated below.

As an example, the group II-VI compound may be selected from the group consisting of: binary compounds selected from the group consisting of CdO, CdS, CdSe, CdTe, ZnO, ZnS, ZnSe, ZnTe, HgS, HgSe, HgTe, MgSe, MgS, and a mixture thereof; ternary compounds selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and quaternary compounds selected from the group consisting of CdZnSeS, CdZnSeTe, CdZnSTe, CdHgSeS, CdHgSeTe, CdHgSTe, HgZnSeS, HgZnSeTe, HgZnSTe, and a mixture thereof.

As another example, the group III-V compound may be selected from the group consisting of: binary compounds selected from the group consisting of GaN, GaP, GaAs, GaSb, AlN, AlP, AlAs, AlSb, InN, InP, InAs, InSb, and a mixture thereof; ternary compounds selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and quaternary compounds selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

As another example, the group IV-VI compound may be selected from the group consisting of: binary compounds selected from the group consisting of SnS, SnSe, SnTe, PbS, PbSe, PbTe, and a mixture thereof; ternary compounds selected from the group consisting of SnSeS, SnSeTe, SnSTe, PbSeS, PbSeTe, PbSTe, SnPbS, SnPbSe, SnPbTe, and a mixture thereof; and quaternary compounds selected from the group consisting of SnPbSSe, SnPbSeTe, SnPbSTe, and a mixture thereof.

As another example, the group IV element may be selected from the group consisting of Si, Ge, and a mixture thereof. The group IV compound may be a binary compound selected from the group consisting of SiC, SiGe, and a mixture thereof.

The aforementioned binary compounds, ternary compounds, or quaternary compounds may be present in a uniform concentration within a particle, or the compounds may be present in a state in which the concentration distribution is partially differently divided, within the same particle. Alternatively, the compounds may have a core-shell structure in which one quantum dot encloses another quantum dot. The interface between the core and the shell may have a concentration gradient in which the concentration of an element present in the shell decreases toward the center.

A portion of the surface of the quantum dot may be substituted with an organic ligand. The organic ligand may be bound to the surface of the quantum dot to stabilize the quantum dot. Non-limiting examples of available organic ligands may include: $C_5$-$C_{20}$ alkyl carboxylic acids, alkenyl carboxylic acids, or alkynyl carboxylic acids; pyridine; mercapto alcohols; thiols; phosphines; phosphine oxides; primary amines; secondary amines; or a combination thereof. A method of substituting a portion of the surface of the quantum dot with an organic ligand is not limited in the present invention, and may employ a common method that is performed in the art.

The form of the quantum dot is not particularly limited as long as it has a form that is generally used in the art. For example, spherical, rod-shaped, pyramidal, disk-shaped, multi-arm, or cubic nanoparticles, nanotubes, nanowires, nanofibers, nanoplatelet particles, and the like may be used.

The size of the quantum dot is not particularly limited. The size may be appropriately adjusted within a conventional range that is known in the art. For example, the average particle diameter ($D_{50}$) of the quantum dot may be 1 to 20 nm, and specifically 2 to 15 nm. When the particle size of the quantum dot is controlled to a range of approximately 1 to 20 nm as described above, the quantum dot can exhibit light of a desired color. For example, if the quantum dot core containing CdSe has a diameter of about 2.5 to 3 nm, the quantum dot may emit light of a wavelength of about 500 to 550 nm, and if the quantum dot core containing CdSe has a diameter of about 3.5 to 4 nm, the quantum dot may emit light of a wavelength of about 580 to 650 nm. Specifically, a quantum dot (QD) emitting light in the range of 370 to 440 nm when absorbing a wavelength of 365 nm may be used in the present invention. For example, as blue light-emitting quantum dots (QDs), Cd-based group II-VI QDs (e.g., CdZnS, CdZnSSe, CdZnSe, CdS, or CdSe), and non-Cd-based group II-VI QDs (e.g., ZnSe, ZnTe, ZnS, or HgS), or non-Cd-based group—V QDs (e.g., InP, InGaP, InZnP, GaN, GaAs, or GaP) may be used.

Additionally, the quantum dot may have a full width of half maximum (FWHM) of a light light-emitting wavelength spectrum of about 45 nm or less, preferably about 40 nm or less, and more preferably about 30 nm or less. In such a range, color purity or color reproducibility can be improved. Because light emitted through these quantum dots is emitted in all directions, the viewing angle may be improved.

The present invention may include at least one type of common red light-emitting quantum dots, green light-emitting quantum dots, or blue light-emitting quantum dots known in the art, and specifically, may be configured to include all of these.

The content of the quantum dots may be appropriately adjusted within a range known in the art, but the range is not particularly limited. For example, the quantum dots may be contained in a content of 30 wt % or less, specifically, 1 to 30 wt %, or more specifically 2 to 15 wt %, relative to the total weight (e.g., 100 wt %) of the light-emitting layer ink composition.

Dispersant

The light-emitting layer ink composition according to the present invention contains a dispersant.

The dispersant is not particularly limited to the type thereof as long as it can uniformly disperse the above-described quantum dots and/or other components. As one example, a (meth)acrylic based monomer may be used as the dispersant, and specifically, a di(meth)acrylate monomer containing two (meth)acrylate functional groups in one molecule is preferably used.

In general, the important factors to determine effective jetting properties of an ink may include viscosity (μ), density (σ), and surface tension (ρ) of a solution, and nozzle diameter (L) according to Equation 1 below. These variables are expressed using the Z value ($Z^{-1}$), which is the reciprocal of the Ohnesorge number (Oh), from which the behavior of ejected droplets according to the properties of a liquid can be numerically predicted.

$$Oh = \frac{\mu}{\sqrt{\rho\sigma L}} = Z^{-1} \quad (1)$$

For example, if an inkjet solution containing no dispersant has a viscosity of 2 cps, a density of 0.95 g/ml, and a surface tension of 36 mN/m and the nozzle diameter is 21.5 μm, the Z value ($Z^{-1}$) is about 13.5. The addition of a dispersant with a viscosity of about 8-9 cps increases the viscosity by about 2.8-3.5 cps (e.g., 2 cps) compared with the existing inkjet solution, and thus the Z value ($Z^{-1}$) of the inkjet solution decreases to 10 or smaller (e.g., a density of 0.96 g/ml, a surface tension of 38 mN/m, and same nozzle diameter). However, when the viscosity value of a dispersant to be applied is too large, the Z value ($Z^{-1}$) may be rather lowered, and thus inkjet ejection may be difficult.

In the present invention, a (meth)acrylic based monomer may be adopted as a dispersant considering the above-described Z value ($Z^{-1}$), and as such the (meth)acrylic based monomer dispersant is most appropriate as a component for an inkjet solvent that currently applied, in terms of viscosity characteristics. The surface tension of the (meth)acrylic based monomer dispersant is relatively higher compared with an existing applied inkjet solvent, but the numerical change in the denominator to which the surface tension (σ) is applied is not significant as shown in Equation 1. As described above, in the present invention, a stable droplet can be formed by adopting the (meth)acrylic based monomer dispersant and adjusting the use amount thereof to a predetermined range. Thereby, the shape of the resultant pattern can also be improved.

Non-limiting examples of available (meth)acrylic based monomer dispersants may include ethylene glycol di(meth) acrylate, propylene glycol di(meth)acrylate, polyolefin glycol di(meth)acrylate, ethoxylated polypropylene glycol di(meth)acrylate, 2-hydroxy-3-acryloyloxy propyl methacrylate, 2-hydroxy-1,3-dimethacryloxypropane, dioxane glycol di(meth)acrylate, tricyclodecane dimethanol di(meth) acrylate, 1,4-butanediol di(meth)acrylate, glycerin di(meth) acrylate, 1,6-hexanediol di(meth)acrylate, 1,9-nonanediol di(meth)acrylate, 1,10-decanediol di(meth)acrylate, neopentyl glycol di(meth)acrylate, 2-methyl-1,8-octanediol di(meth)acrylate, 1,9-nonanediol di(meth)acrylate, butyl ethyl propanediol di(meth)acrylate, 3-methyl-1,5-pentanediol di(meth)acrylate, and a di(meth)acrylate having an aromatic ring, such as ethoxylated bisphenol A di(meth)acrylate, propoxylated ethoxylated bisphenol A di(meth)acrylate, or ethoxylated bisphenol F di(meth)acrylate. The above-described components may be used alone or in a mixture of two or more.

In an embodiment, the dispersant may have a weight average molecular weight (Mw) of about 70 g/mol or more, more specifically about 150 g/mol to about 1,200 g/mol, and a viscosity of about 2 cps to 10 cps (25° C.).

In the present invention, the content of the dispersant may be appropriately adjusted within a range known in the art, but the content is not particularly limited. As an example, the dispersant may be contained in a content of 30 vol % or less, specifically 5 to 30 vol %, relative to 100 vol % of a solvent to be described below. The content of the dispersant may be expressed as a volume ratio. For example, the content ratio of an ink containing quantum dots dissolved therein and a dispersant may be a volume ratio of 1:10 to 100 when mixed. In an embodiment, 1-10 μl of the dispersant may be added to 1 ml of an ink containing quantum dots dissolved therein.

As another example, the dispersant may be contained in a content of 0.1 to 10 wt %, and specifically 0.1 to 4 wt %, relative to 100 wt % of the quantum dot solution containing quantum dots and a solvent. The dispersant, when having a content corresponding to the above-described range, can achieve well mixing of the respective component and exhibit excellent workability and processability, and enables the formation of a uniform film through the alleviation of the coffee ring effect. Additionally, such a dispersant can exhibit an improvement in surface roughness of a light-emitting layer compared with a control group not containing an acrylic monomer dispersant.

Solvent

The light-emitting layer ink composition according to the present invention contains a common solvent known in the art without limitation, and the composition of the solvent is configured such that the vapor pressure is 0.001 mmHg or higher.

That is, in the self-luminous electroluminescent device, electrons and holes injected from the outside through electrodes meet in the light-emitting layer (EML) to emit light of a specific wavelength of quantum dots. The presence of multiple materials with dielectric characteristics in the light-emitting layer impedes the transport of electrons and holes, resulting in difficulty in normal driving of the device.

In the present disclosure, the solvent and/or dispersion media contained in the light-emitting layer ink composition mostly volatilize under general fabrication conditions of devices. This results in no other materials other than the quantum dots remaining in the final mission layer. To improve volatility, a solvent having a vapor pressure of 0.001 mmHg or higher may be adopted and used when the solvent is used alone. Alternatively, a solvent with a relatively low vapor pressure and a solvent with a relatively high vapor pressure are mixed at a predetermined ratio, which is adjusted to satisfy the above-described vapor pressure numerical range.

The light-emitting layer ink composition according to the present invention is not particularly limited to specific components of the solvent constituting the composition, and/or the contents thereof, composition thereof, and the like as long as the above-described vapor pressure characteristics are satisfied.

Non-limiting examples of available solvents include hexane, octane, decane, dodecane, styrene, cyclohexylbenzene, chlorobenzene, dichlorobenzene, cyclohexanone, hexadecane, and the like. The above-described components may be used alone or in a mixture of two or more thereof.

In the present invention, the content of the solvent is not particularly limited and may be appropriately adjusted within a range known in the art. For instance, the content of the solvent may be the remainder that satisfies 100 parts by weight of the light-emitting layer ink composition, specifically 70 to 95 parts by weight.

In addition to the above-described components, the light-emitting layer ink composition of the present invention may further contain at least one additive known in the art within a range that does not hinder advantageous effects of the present invention.

The light-emitting layer ink composition described herein contains quantum dots (QDs), the (meth)acrylic based dispersant, and at least one solvent with a controlled vapor pressure, and optionally other additives to be blended as necessary, wherein the light-emitting layer ink composition may be prepared by mixing and stirring the components by a common method known in the art.

The mixing method is not particularly limited, and for example, a common mixer known in the art, such as Homo Disper, Homo Mixer, a universal mixer, a planetary mixer, a kneader, or a three-roller mill may be used.

The light-emitting layer ink composition prepared as described above may contain, relative to the total weight of the composition, 1 to 30 parts by weight of quantum dots, 0.1 to 10 parts by weight of the (meth)acrylic based dispersant, and the remainder being a solvent, and more specifically, 2 to 15 parts by weight of quantum dots, 0.1 to 4 parts by weight of the (meth)acrylic based dispersant, and the remainder being a solvent. However, the light-emitting layer ink composition is not limited thereto.

The ejection conditions of the inkjet equipment may be largely classified into viscosity and vapor pressure. A too high or low viscosity prevents the formation of a uniform film, and the degree of ejection is determined by vapor pressure. The light-emitting layer ink composition is configured by adopting a solvent and adjusting the content thereof in consideration of the viscosity and vapor pressure appropriate for inkjet ejection. The light-emitting layer ink composition of the present disclosure can provide excellent workability and processability by optimization of various characteristics, such as viscosity, vapor pressure, and contact angle, and particularly, can be usefully applied to inkjet printing to implement device characteristics by ensuring uniformity and stability in all aspects of inkjet ejection properties, the shape of ejected ink, and the shape of a finally formed pattern.

In an embodiment, the composition may have a viscosity of 1.0 to 5.0 cps at 20° C., a vapor pressure of 0.1 to 10 mmHg at 20° C., a contact angle of 10 to 30°, and a solid content of 30 w % or less. More specifically, the composition may have a viscosity of 2.0 to 4.0 cps at 20° C., a vapor pressure of 1.0 to 5.0 mmHg at 20° C., a contact angle of 15 to 25°, and a solid content of 5 to 30 w %.

In another embodiment, the Z value ($Z^{-1}$), which is the reciprocal of the Ohnesorge number of the inkjet composition, as calculated according to Equation 1 above, may be 1 to 10. The above-described Z value enables the prediction of ejection feasibility, the shape of ejected droplets, and the like.

Immediately after jetting of the light-emitting layer ink composition containing a solvent with a predetermined vapor pressure, the height of a pattern containing the solvent is relatively high. However, as the time passes, the solvent is volatilized and removed by drying, without a separate drying process, leading to the formation of a uniform, thin, and high-quality light-emitting layer composed of quantum dots.

In another embodiment, an ink pattern (e.g., a light-emitting layer) formed after the jetting of the composition may contain the solvent and the dispersant in a content of 10 vol % or less, through the removal of volatile components.

In another embodiment, the ink pattern (e.g., a light-emitting layer) formed after jetting may have a height (HI) of 500 to 2,000 nm, and the printed pattern after drying may have a height (HF) of 5 to 60 nm.

Light-Emitting Device

A light-emitting device according to an embodiment of the present invention includes a light-emitting layer formed of the above-described light-emitting layer ink composition.

In an embodiment, the light-emitting device includes: a first electrode; a second electrode disposed to face the first electrode; a light-emitting layer disposed between the first electrode and the second electrode and formed of the above-descried light-emitting layer ink composition; a hole transport layer disposed between the first electrode and the light-emitting layer; and an electron transport layer disposed between the light-emitting layer and the second electrode. The light-emitting device may further include, as needed, at least one of a hole injection layer or an electron injection layer.

Hereinafter, the present invention will be described using a quantum dot light-emitting device as an example. However, the light-emitting device of the present invention is not limited thereto and can be applied to various types of light-emitting devices, such as an organic light-emitting device.

The first electrode is disposed on the substrate. This substrate may be a glass substrate or transparent plastic substrate that is transparent and has a flat surface. The substrate may be used after ultrasonic cleaning with a solvent, such as isopropyl alcohol, acetone, or methanol, followed by ultraviolet (UV)-ozone treatment for removing contaminants.

The first electrode may serve as a positive electrode. For example, the positive electrode may be formed of metal oxides satisfying each transparent/opaque condition or other non-oxide inorganic materials, including metals. For bottom light-emitting, the first electrode may be formed of a transparent conductive metal, such as transparent indium tin oxide (ITO), indium zinc oxide (IZO), indium tin zinc oxide (ITZO), or aluminum-doped zinc oxide (AZO).

The hole injection layer and the hole transport layer are disposed on the first electrode. These hole injection layers and hole transport layers facilitate the injection of holes from the first electrode and serve to transfer holes to the light-emitting layer. The hole transport layer may be formed of an organic or inorganic material. Examples of the organic material may include 4,4'-N,N'-dicarbazole-biphenyl (CBP), N,N'-diphenyl-N,N'-bis(1=naphtyl)-1,1'-biphenyl-4,4"-diamine (α-NPD), 4,4',4"-tris(N-carbazolyl)-triphenylamine (TCTA), TFB, or N,N'-di(4-(N,N'-diphenyl-amino)phenyl)-N.N'-diphenylbenzidine (DNTPD), and examples of the inorganic material may include an oxide, such as NiO or $MoO_3$. For instance, poly(ethylenedioxythiophene):polystyrene sulphonate (PEDOT:PSS) may be provided for the hole injection layer. In addition, TFB or poly(9-vinylcarbazole) (PVK) may be provided for the hole transport layer.

The light-emitting layer may be disposed on the hole transport layer, and quantum dots may be provided for the light-emitting layer. For example, the light-emitting layer may be formed by inkjet printing the above-described light-emitting layer ink composition and volatilizing the solvent.

The electron transport layer facilitates the injection of electrons from the second electrode and serves to transport electrons to the light-emitting layer. This electron transport layer may employ a conventional electron transport material known in the art without limitation, and examples thereof may include ZnO, Zn-containing metal oxide nanoparticles alloyed with a metal capable of increasing the ZnO band gap, or the like. For example, the electron transport layer may be formed by coating a dispersion, in which a metal oxide is dispersed in a solvent, on the light-emitting layer by a solution process and then volatilizing the solvent. Examples of the coating method may include drop casting, spin coating, dip coating, spray coating, flow coating, screen printing, or inkjet printing, which may be used alone or in combination. The electron transport layer of the present disclosure may be provided as a single layer structure that also serves as an electron injection layer, or may be formed as a lamination structure with a separate electron injection layer.

The second electrode is disposed on the electron injection/transport layers and may serve as a negative electrode. The second electrode may be formed of metal oxides satisfying each transparent/opaque condition or other non-oxide inorganic materials, including metals. Particularly, the second electrode may be an electrode of a metal having a low work function to facilitate the injection of electrons into the LUMO level of the light-emitting layer and having excellent internal reflectivity. Specifically, metals having a low work function to facilitate the injection of electrons, that is, I, Ca, Ba, Ca/Al, LiF/Ca, LiF/Al, $BaF_2$/Al, $BaF_2$/Ca/Al, Al, Mg, Ag:Mg alloys, and the like may be used.

In the above description, the light-emitting device according to the present embodiment has been assumed to be a quantum dot light-emitting device. However, the light-emitting device according to the present embodiment may include various types of light-emitting devices. For instance, the light-emitting device may be an organic light-emitting device. Although the present embodiment has been described wherein the electron injection/transport layers are formed of a single material, the electron injection layer and the electron transport layer may be provided separately.

Hereinafter, the present disclosure will be described in detail with reference to examples. However, the following examples are merely for illustrating the present disclosure and are not intended to limit the scope of the present disclosure.

Example 1. Preparation of Light-Emitting Layer Ink Compositions for Inkjet Printing Each quantum dot solution in which quantum dots were dispersed in a colloidal form in toluene may be used. Red quantum dots employed quantum dots with a core-shell structure composed of indium phosphide (InP)/zinc selenide (ZnSe). Green quantum dots employed green indium phosphide (InP)/zinc sulfide (ZnS). In addition, blue quantum dots employed quantum dots with a structure of a core and multiple shells composed of zinc selenium tellurium (ZnSeTe)/zinc selenide (ZnSe)/zinc sulfide (ZnS). Ligands for the red, green, and blue quantum dots were composed of oleic acid.

The solutions in which the above-described quantum dots were dispersed were separately centrifuged to obtain quantum dots, which were then dispersed in a solvent composed of cyclohexylbenzene (vapor pressure: 1 mmHg) and cyclohexanone (vapor pressure: 3 mmHg) at a volume ratio of 8:2. Particularly, the concentration of red quantum dots was 45 mg/ml, the concentration of green quantum dots was 80 mg/ml, and the concentration of blue quantum dots was 35 mg/ml. Thereafter, 2 wt % of an acrylic dispersant (diethylene glycol dimethacrylate) was added to each of the quantum dot dispersed solutions to prepare light-emitting layer ink compositions capable of inkjet printing.

FIG. 1 shows an image illustrating the light-emitting layer ink compositions of Example 1, in which the acrylic dispersant was dispersed. The Z value ($Z^{-1}$), which is the reciprocal of the Ohnesorge number, was 8.75 as calculated according to Equation 1 above.

Comparative Example 1. Preparation of Light-Emitting Layer Ink Compositions for Inkjet Printing Light-emitting layer ink compositions for inkjet printing of Comparative Example 1 were prepared by the same method as in Example 1 except that red, green, and blue quantum dots were formed and then dispersed at 18 mg/ml in an octane solvent (vapor pressure: 11 mmHg), instead of the mixture solvent of cyclohexylbenzene and cyclohexanone. The Z value ($Z^{-1}$), which is the reciprocal of the Ohnesorge number, was 35.49 as calculated according to Equation 1 above (density: 0.703 g/ml, surface tension: 21.61 mN/m, same nozzle diameter, and viscosity: 0.509 cps). The prepared inks were evaluated for jetting and patterns by the same method as in Example 1.

Comparative Example 2. Preparation of Light-Emitting Layer Ink Compositions for Inkjet Printing Light-emitting layer ink compositions of Comparative Example 2 were prepared by the same method as in Example 1 except that an acrylic dispersant was not used. The Z value ($Z^{-1}$), which is the reciprocal of the Ohnesorge number, was 13.55 as calculated according to Equation 1 above. The prepared inks were evaluated for jetting and patterns by the same method as in Example 1.

Test Example 1: Evaluation of Inkjet Ejection and Shape

The light-emitting layer ink compositions prepared in Example 1 and Comparative Examples 1 and 2 were evaluated for the ejection and shape according to inkjet printing by the following methods, separately. The results are shown in Table 1 and FIGS. 2 to 7.

(1) Jetting Performance

The feasibility of inkjet printing was evaluated by mounting each of the obtained light-emitting layer inkjet compositions on a cartridge printing head (Fuji Film Dimatix 10 pL, DMC-11610) and then ejecting the same in the form of a 1-drop pattern through inkjet printing equipment (Omnijet 200).

(2) Quantum Dot Patterns of Inkjet Printing

To analyze quantum dot patterns formed on a substrate, a Full Auto non-contact three-dimensional surface morphology meter (NV9000, resolution: 0.06 nm) was used. To quantify the degree of coffee ring effect (CRF), Equation 2 below was introduced, and the results are shown in Table 1.

$$CRF = \frac{H_{Max}}{H_{Min}} \tag{2}$$

In Equation 2, $H_{Max}$ represents the maximum thickness of a pattern, $H_{Min}$ represents the minimum thickness of a pattern, and the CRF value represents the degree of coffee ring effect. That is, CRF=1 indicates that the coffee ring has been completely removed.

TABLE 1

| | | Dot | Line-minor axis | Line-major axis |
|---|---|---|---|---|
| Red | Example 1 | 1.122 | 1.054 | 1.107 |
| | Comparative Example 2 | 1.330 | 1.139 | 1.539 |
| | Comparative Example 1 | | Unable to form pattern | |
| Green | Example 1 | 1.039 | 1.140 | 1.090 |
| | Comparative Example 2 | 1.063 | 1.074 | 1.348 |
| | Comparative Example 1 | | Patten impossible | |
| Blue | Example 1 | 1.044 | 1.035 | 1.089 |
| | Comparative Example 2 | 1.227 | 1.128 | 1.579 |
| | Comparative Example 1 | | Unable to form pattern | |

droplets were stable without the formation of tails or additional droplets. Therefore, the ejection properties of droplets could be numerically predicted before jetting through Z values of ink compositions.

Test Example 2: Evaluation of Degree of Inkjet Volatilization and Height of Pattern The light-emitting layer ink compositions prepared in Example 1 and Comparative Examples 1 and 2 were evaluated for the degree of inkjet volatilization and the height of a formed pattern according to inkjet printing. The results are shown in Table 2.

Specifically, the degrees of volatilization of solvents and dispersants used in electroluminescent quantum dot inks were investigated by measuring the height (HI) of patterns immediately after jetting of each of the light-emitting layer ink compositions on a substrate and the height (HF) of patterns after drying at 25° C. for 60 minutes.

TABLE 2

| Sample | | | Pattern height (nm) | | |
|---|---|---|---|---|---|
| | | | Dot | Line-minor axis | Line-major axis |
| Red | Example 1 | After jetting ($H_I$) | 814.27 | 730.49 | 1537.14 |
| | | After drying ($H_F$) | 21.08 | 26.33 | 26.25 |
| | Comparative Example 2 | After jetting ($H_I$) | 857.56 | 769.52 | 1320.44 |
| | | After drying($H_F$) | 30.15 | 40.49 | 49.41 |
| | Comparative Example 1 | | | Unable to form pattern | |
| Green | Example 1 | After jetting ($H_I$) | 1023.45 | 920.81 | 1818.78 |
| | | After drying ($H_F$) | 35.17 | 46.00 | 46.89 |
| | Comparative Example 2 | After jetting ($H_I$) | 978.47 | 933.62 | 1606.76 |
| | | After drying ($H_F$) | 31.64 | 34.12 | 41.19 |
| | Comparative Example 1 | | | Unable to form pattern | |
| Blue | Example 1 | After jetting ($H_I$) | 759.36 | 579.02 | 1172.00 |
| | | After drying ($H_F$) | 17.79 | 18.83 | 17.00 |
| | Comparative Example 2 | After jetting ($H_I$) | 699.10 | 645.84 | 1478.91 |
| | | After drying ($H_F$) | 25.56 | 28.28 | 41.39 |
| | Comparative Example 1 | | | Unable to form pattern | |

As shown in Table 1, the ejection and pattern formation obtained through an inkjet method were impossible in Comparative Example 1, and Comparative Example 2 showed relatively poor characteristics compared with Example 1. On the other hand, the light-emitting layer ink compositions of the present invention containing a dispersant facilitated ejection from general inkjet printing equipment exhibited uniform characteristics where the shapes of an ejected ink and an ink formed on the substrate were close to 1. Therefore, the light-emitting layer ink composition of the present invention can be advantageously applied to inkjet printing (see FIGS. 2 to 7).

Figure 2:
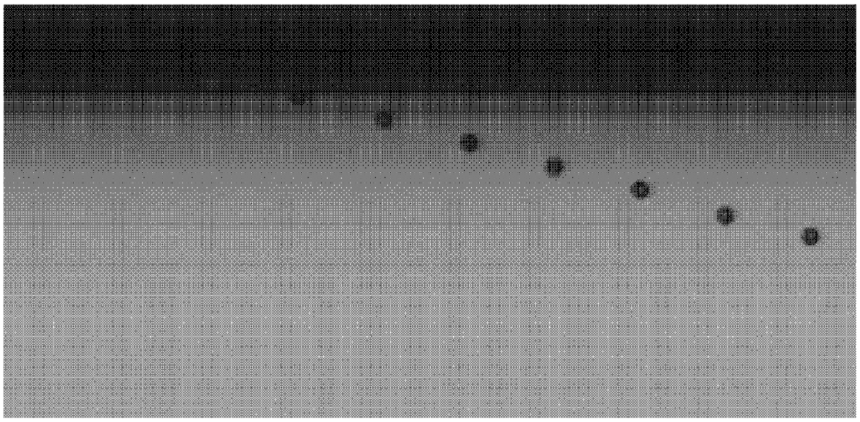
FIG. 2 shows an image of an ejected ink using a light-emitting layer ink composition prepared in Example 1.
Figure 3:
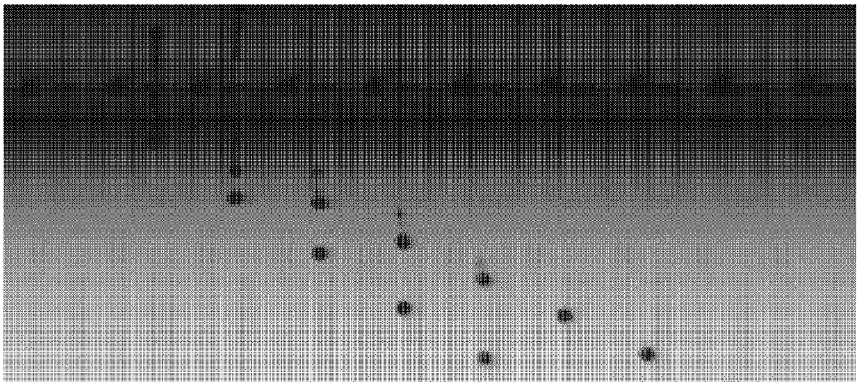
FIG. 3 shows an image of an ejected ink using a light-emitting layer ink composition prepared in Comparative Example 1.
Figure 4:
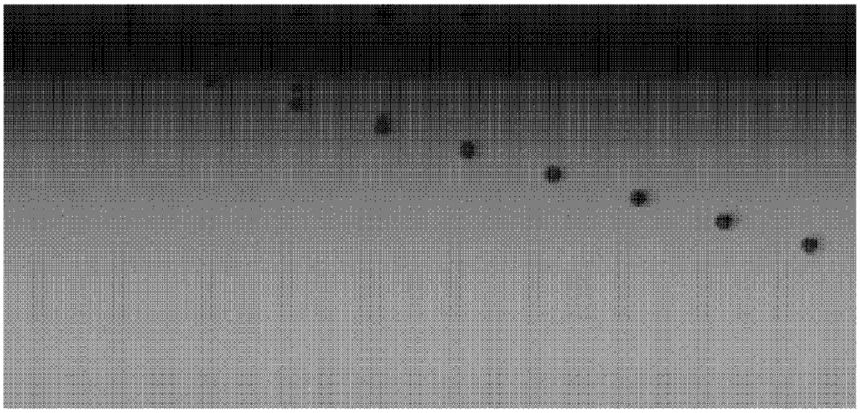
FIG. 4 shows an image of an ejected ink using a light-emitting layer ink composition prepared in Comparative Example 2.
Figure 5:
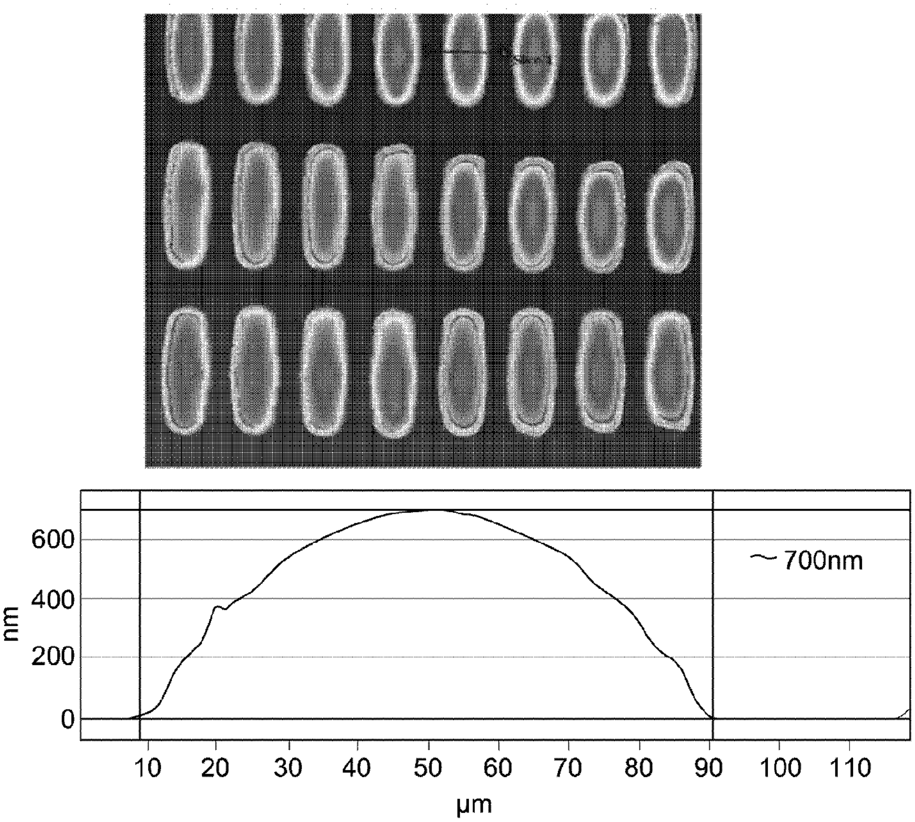
FIG. 5 shows an image of evaluating the pattern thickness immediately after jetting of a red light-emitting layer ink composition prepared in Example 1.
Figure 6A:
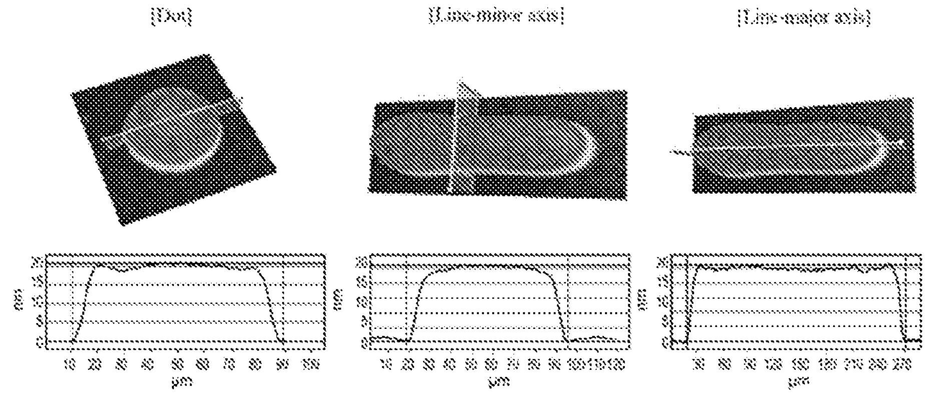
FIGS. 6A, 6B, and 6C respectively show images of analyzing R, G, and B patterns immediately after jetting of light-emitting layer ink compositions prepared in Example 1.
Figure 6B:
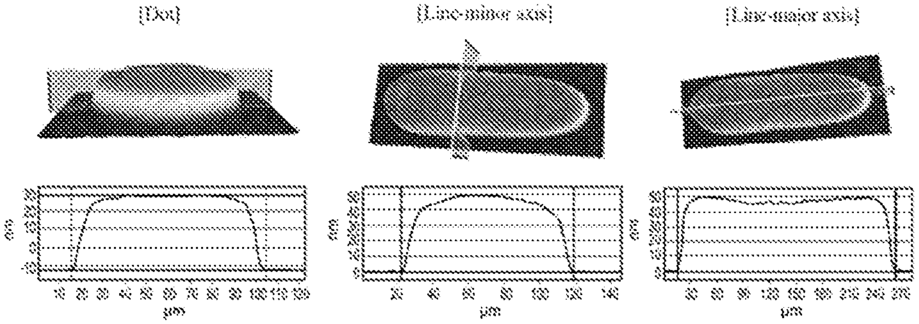
Figure 6C:
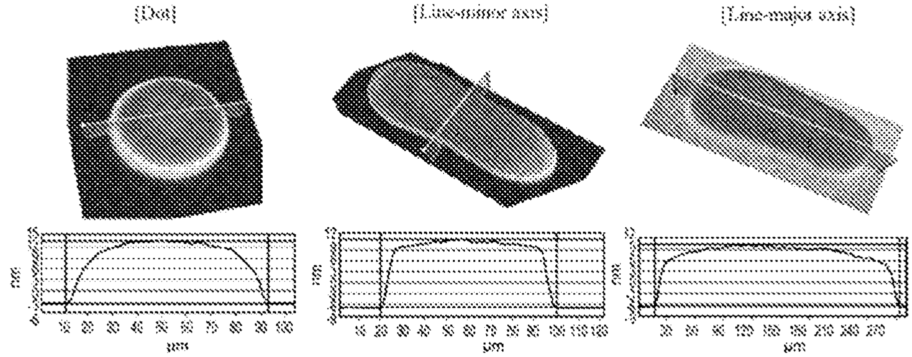
Figure 7A:
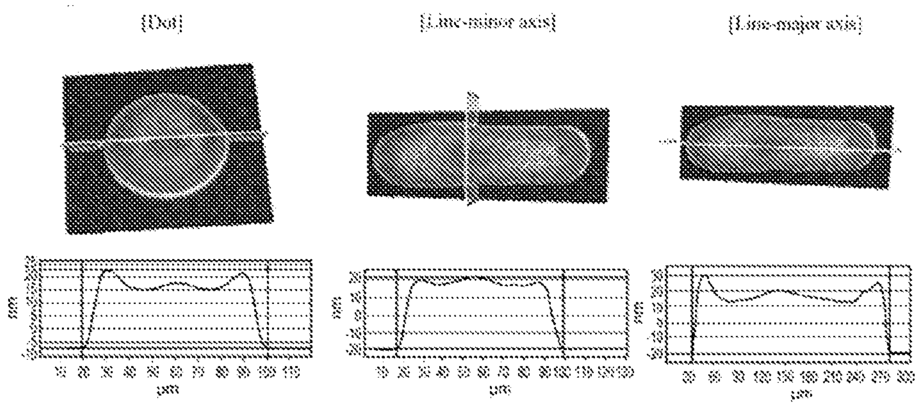
FIGS. 7A, 7B, and 7C respectively show images of analyzing R, G, and B patterns immediately after jetting of light-emitting layer ink compositions prepared in Comparative Example 2.
Figure 7B:
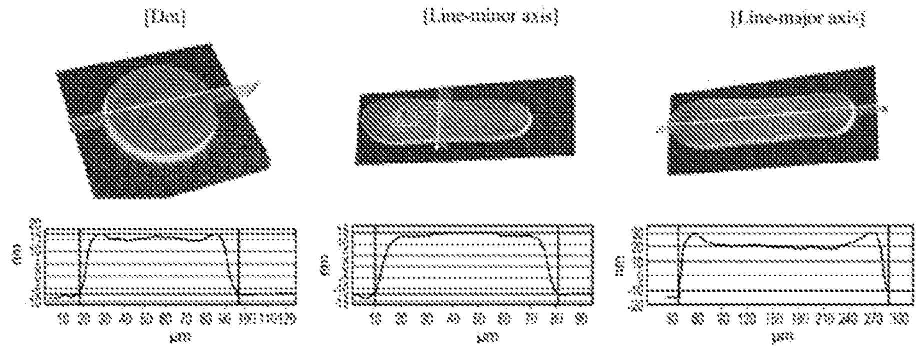
Figure 7C:
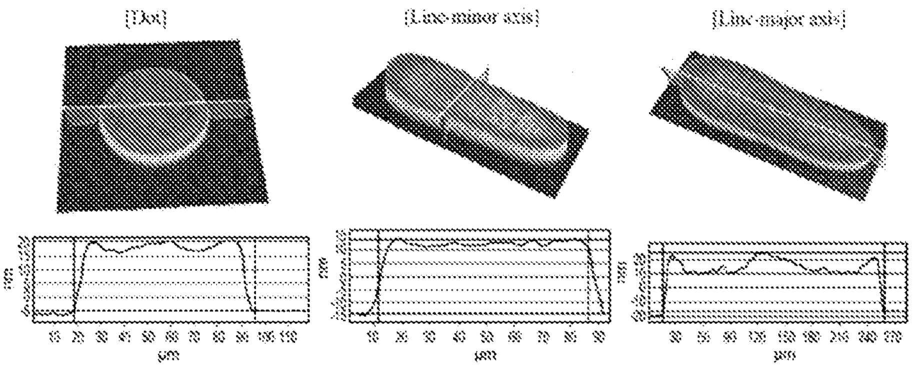
Figure 8:
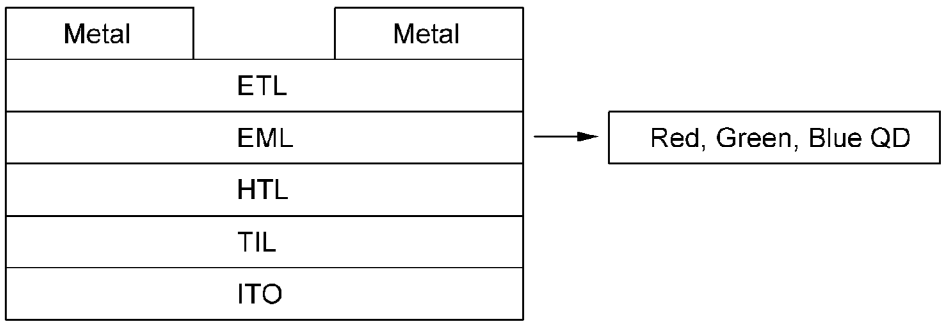
FIG. 8 shows a cross-sectional structure of an electroluminescent device.
Figure 9:
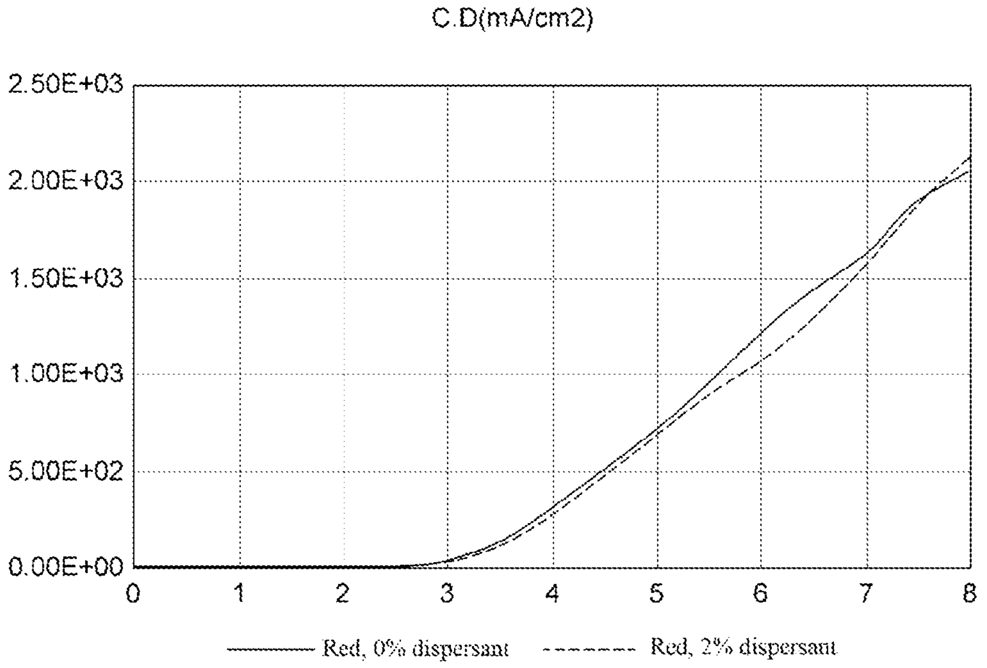
FIG. 9 shows a graph illustrating current density characteristics of red light-emitting devices fabricated using light-emitting layer ink compositions of Example 1 and Comparative Example 2.
Figure 10:
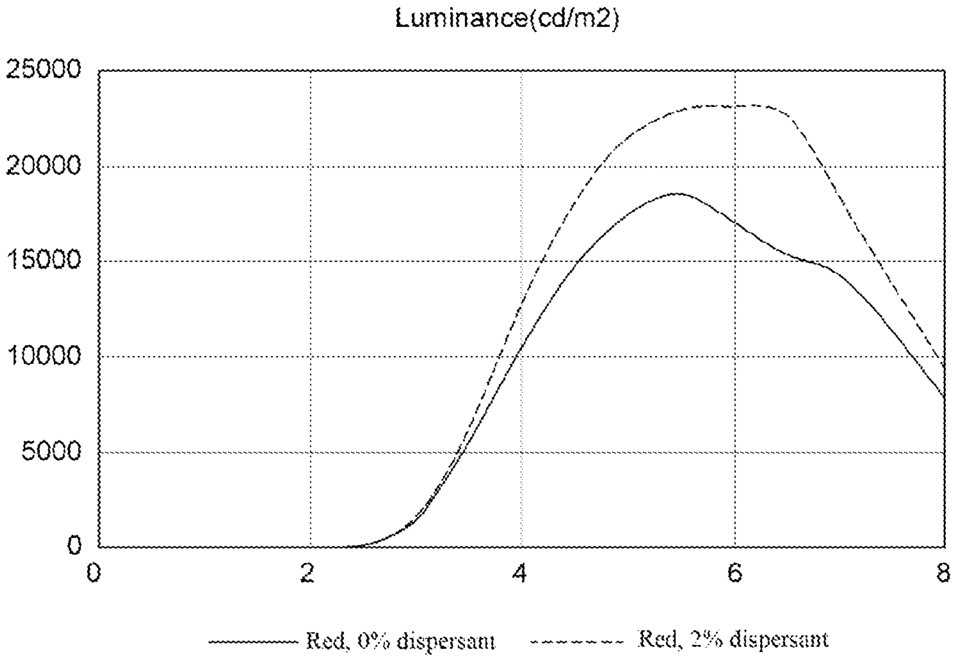
FIG. 10 shows a graph illustrating luminous efficiency characteristics of red light-emitting devices fabricated using light-emitting layer ink compositions of Example 1 and Comparative Example 2.
Figure 11:
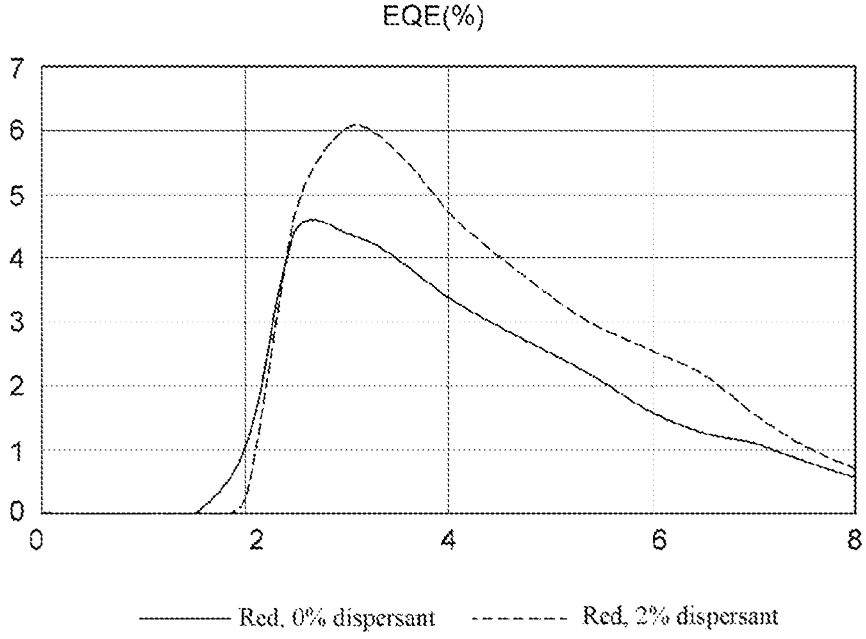
FIG. 11 shows a graph illustrating quantum efficiency characteristics of red light-emitting devices fabricated using light-emitting layer ink compositions of Example 1 and Comparative Example 2.
Figure 12:
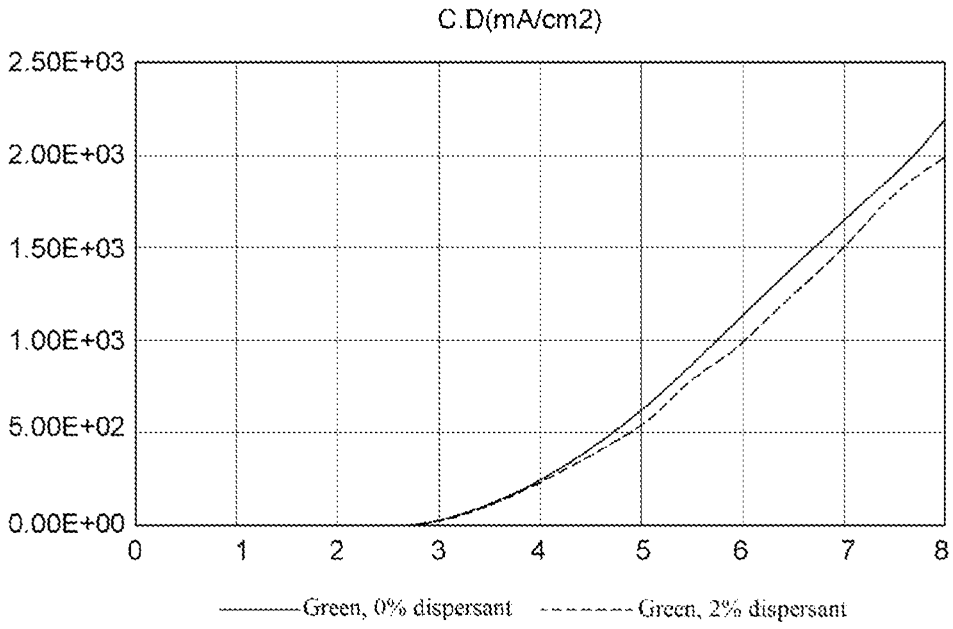
FIG. 12 shows a graph illustrating current density characteristics of green light-emitting devices fabricated using light-emitting layer ink compositions of Example 1 and Comparative Example 2.
Figure 13:
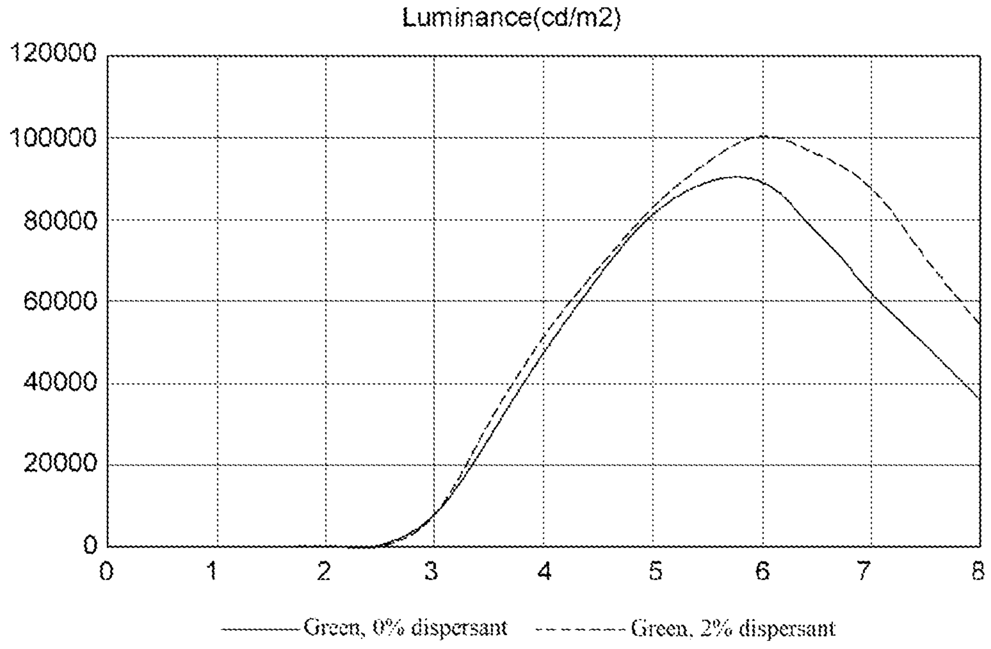
FIG. 13 shows a graph illustrating luminous efficiency of green light-emitting devices fabricated using light-emitting layer ink compositions of Example 1 and Comparative Example 2.
Figure 14:
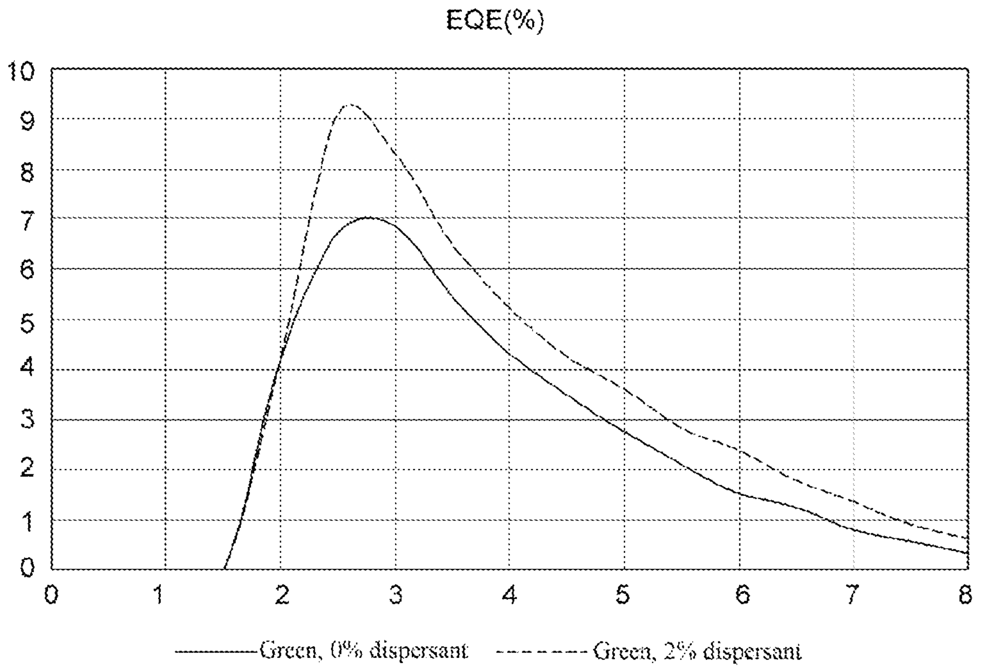
FIG. 14 shows a graph illustrating quantum efficiency characteristics of green light-emitting devices fabricated using light-emitting layer ink compositions of Example 1 and Comparative Example 2.
Figure 15:
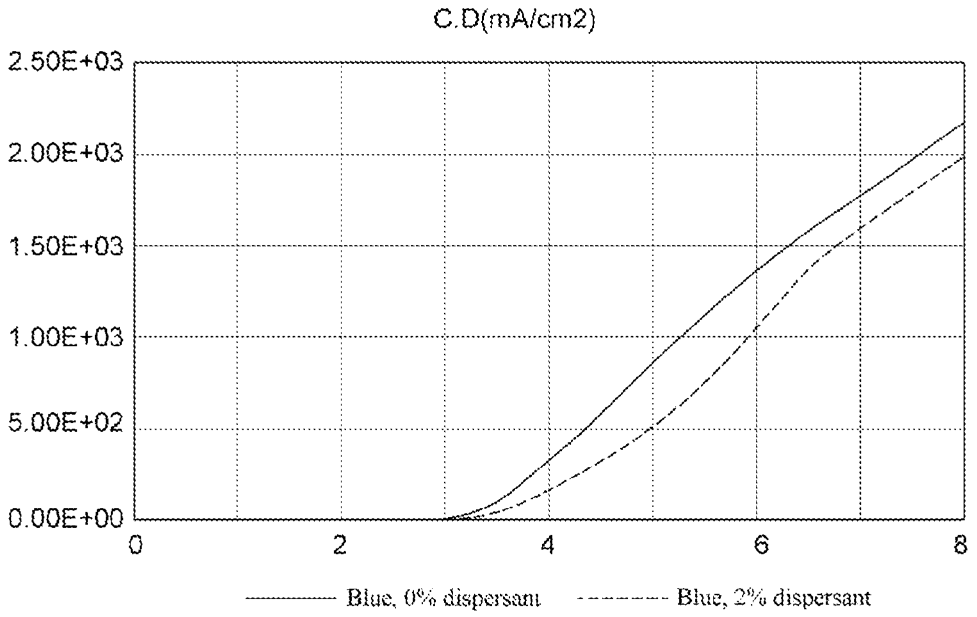
FIG. 15 shows a graph illustrating current density characteristics of blue light-emitting devices fabricated using light-emitting layer ink compositions of Example 1 and Comparative Example 2.
Figure 16:
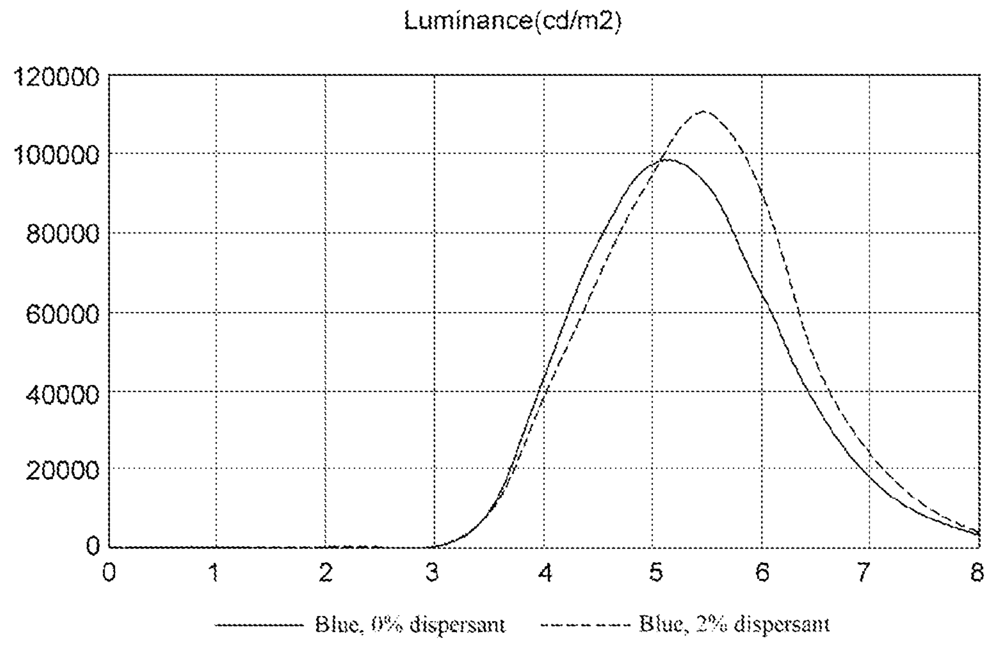
FIG. 16 shows a graph illustrating luminous efficiency of blue light-emitting devices fabricated using light-emitting layer ink compositions of Example 1 and Comparative Example 2.
Figure 17:
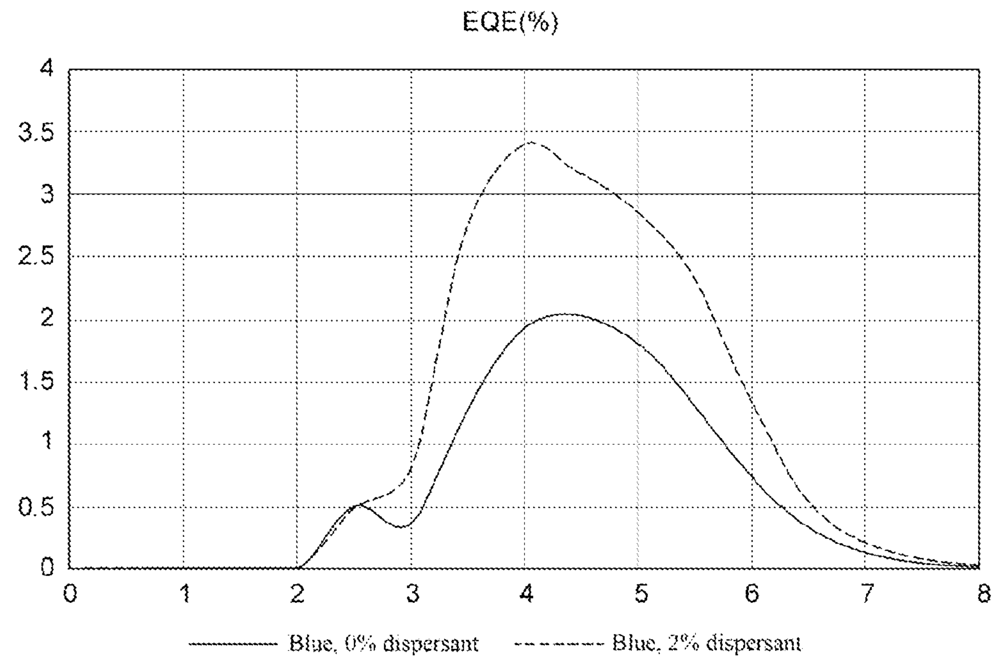
FIG. 17 shows a graph illustrating quantum efficiency characteristics of blue light-emitting devices fabricated using light-emitting layer ink compositions of Example 1 and Comparative Example 2.

Meanwhile, the ejection feasibility of an ink, the shape of ejected droplets, and the like could be predicted through Z value ($Z^{-1}$), which is the reciprocal of the Ohnesorge number. As shown in FIGS. 2 to 4, Comparative Example 1 had a very high Z value (35.49) and thus caused a problem involving droplets other than main droplets, and Comparative Example 2 caused additional droplets at the beginning of ejection, resulting in a non-uniform shape of the finally-patterned droplets.

However, Example 1 had a Z value (8.75) capable of forming stable droplets and showed that the ejected ink As shown in Table 2, pattern formation by an inkjet method was impossible in Comparative Example 1, and the height of patterns formed in Comparative Example 2 showed a relatively high trend. However, the light-emitting layer ink compositions of the present invention containing a dispersant showed uniform heights and relatively low heights in terms of patterns immediately after jetting and patterns formed after drying, thereby forming a thin and uniform light-emitting layers.

Test Example 3: Evaluation of Electroluminescent Devices Using Quantum Dots for Inkjet Printing Electroluminescent devices were fabricated using the light-emitting layer ink compositions prepared in Example 1 and Comparative Examples 1 and 2, and then properties thereof were evaluated.

Specifically, an ITO substrate was washed with isopropyl alcohol and acetone for 15 minutes each and then dried in an oven at 60° C. for 30 minutes. The substrate that has been dried was treated with UV-ozone for 20 min, and then spin-coated with PEDOT:PSS, thereby forming a hole injection layer (HIL). Particularly, the spin coating condition was 4,500 rpm/60 sec and the thermal treatment condition was 150° C./20 min.

Thereafter, a film was formed using a Poly-TPD material dissolved at 6 mg/ml in chlorobenzene at 4500 rpm/30 sec under a nitrogen gas ($N_2$) atmosphere and thermally treated for 150° C./30 min to form a hole transport layer (HTL).

Thereafter, a light-emitting layer (EML) was formed on the hole transport layer (HTL) by inkjet printing of each of the ink compositions prepared in Example 1 and Comparative Examples 1 and 2.

Then, zinc oxide nanoparticles were dispersed in an ethanol solvent and spin-coated at 1,500 rpm/30 sec to form an electron transport layer (ETL). Electrodes were formed by vacuum deposition, thereby fabricating electroluminescent devices shown in FIG. 6.

The light-emitting devices of Example 1 and Comparative Example 1 fabricated by the above-described method were evaluated for device efficiency by using IVL measurement equipment, and the results are shown in Table 3 below and FIGS. 9 to 17.

TABLE 3

| | | Efficiency (%) | Luminance (nit) | Voltage (V) |
|---|---|---|---|---|
| Red | Example 1 | 6.0 | 23,400 | 6 |
| | Comparative Example 2 | 4.4 | 18,500 | 5.5 |
| | Comparative Example 1 | Device driving being impossible | | |
| Green | Example 1 | 9.1 | 100,500 | 6 |
| | Comparative Example 2 | 6.8 | 90,00 | 5.5 |
| | Comparative Example 1 | Device driving being impossible | | |
| Blue | Example 1 | 3.3 | 11,060 | 5.5 |
| | Comparative Example 2 | 2.0 | 9,700 | 5 |
| | Comparative Example 1 | Device driving being impossible | | |

As shown in Table 3, the light-emitting devices of Comparative Example 1 were not able to be used for device driving, and the light-emitting devices of Comparative Example 2 showed poor device performance compared with Example 1. However, the light-emitting devices of Example 1 including light-emitting layers formed using the light-emitting layer ink compositions of the present invention had high luminance and excellent luminous efficiency and external quantum efficiency (EQE) for each of R, G, and B (see FIGS. 9 to 17).

The invention claimed is:

1. A light-emitting layer ink composition, comprising:

quantum dots;

a (meth)acrylic based dispersant; and a solvent, wherein the (meth)acrylic based dispersant is contained in a content of 30 vol % or less relative to 100 vol % of the solvent.

2. The light-emitting layer ink composition of claim 1, wherein the solvent has a vapor pressure of 0.001 mmHg or higher.

3. The light-emitting layer ink composition of claim 1, wherein the solvent includes at least two solvents with different vapor pressures.

4. The light-emitting layer ink composition of claim 1, wherein the (meth)acrylic based dispersant is a di(meth) acrylic compound.

5. The light-emitting layer ink composition of claim 1, wherein the quantum dots are contained in a content of 1 to 30 wt % relative to a total weight of the light-emitting layer ink composition.

6. The light-emitting layer ink composition of claim 1, wherein the quantum dots include at least one type of red light-emitting quantum dots, green light-emitting quantum dots, or blue light-emitting quantum dots.

7. The light-emitting layer ink composition of claim 1, wherein the light-emitting layer ink composition has:

a viscosity of 1.0 to 5.0 cps at 20° C., a vapor pressure of 0.1 to 10 mmHg at 20° C., a contact angle of 10 to 30°, and a solid content of 30 wt % or less.

8. The light-emitting layer ink composition of claim 1, wherein, through removal of volatile components, the solvent and the (meth)acrylic based dispersant are contained in a content of 10 vol % or less in an ink pattern formed after jetting of the light-emitting layer ink composition.

9. The light-emitting layer ink composition of claim 1, wherein a height of an ink pattern after jetting is 500 to 2,000 nm and a height of a print pattern after drying is 5 to 60 nm.

10. A light-emitting device, comprising:

a first electrode;

a second electrode disposed to face the first electrode;

a light-emitting layer disposed between the first electrode and the second electrode and formed of a light-emitting layer ink composition; wherein the light-emitting layer ink composition comprises:

quantum dots;

a (meth)acrylic based dispersant; and a solvent, wherein the (meth)acrylic based dispersant is contained in a content of 30 vol % or less relative to 100 vol % of the solvent; and a hole transport layer disposed between the first electrode and the light-emitting layer; and an electron transport layer disposed between the light-emitting layer and the second electrode.

11. The light-emitting device of claim 10, wherein the light-emitting layer is formed by inkjet printing.

12. The light-emitting device of claim 10, further comprising at least one of a hole injection layer or an electron injection layer.

13. The light-emitting device of claim 10, wherein the solvent has a vapor pressure of 0.001 mmHg or higher.

14. The light-emitting device of claim 10, wherein the solvent includes at least two solvents with different vapor pressures.

15. The light-emitting device of claim 10, wherein the (meth)acrylic based dispersant is a di(meth)acrylic compound.

16. The light-emitting device of claim 10, wherein the quantum dots are contained in a content of 1 to 30 wt % relative to a total weight of the light-emitting layer ink composition.

17. The light-emitting device of claim 10, wherein the quantum dots include at least one type of red light-emitting quantum dots, green light-emitting quantum dots, or blue light-emitting quantum dots.

18. The light-emitting device of claim 10, wherein the light-emitting layer ink composition has:

a viscosity of 1.0 to 5.0 cps at 20° C., a vapor pressure of 0.1 to 10 mmHg at 20° C., a contact angle of 10 to 30°, and a solid content of 30 wt % or less.

19. The light-emitting device of claim 10, wherein, through removal of volatile components, the solvent and the (meth)acrylic based dispersant are contained in a content of 10 vol % or less in an ink pattern formed after jetting of the light-emitting layer ink composition.

20. The light-emitting device of claim 10, wherein a height of an ink pattern after jetting is 500 to 2,000 nm and a height of a print pattern after drying is 5 to 60 nm.

* * * * *